(12) United States Patent
Demars

(10) Patent No.: US 7,446,543 B2
(45) Date of Patent: Nov. 4, 2008

(54) NON-CONTACT ELECTRICAL CONNECTIONS TEST DEVICE

(75) Inventor: Patrick Demars, Quaix En Chartreuse (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 11/675,934

(22) Filed: Feb. 16, 2007

(65) Prior Publication Data

US 2007/0194310 A1    Aug. 23, 2007

(30) Foreign Application Priority Data

Feb. 17, 2006    (FR)    ................... 06 01385

(51) Int. Cl.
*G01R 31/302* (2006.01)
(52) U.S. Cl. .................. 324/750; 324/751; 324/753
(58) Field of Classification Search ............. None
See application file for complete search history.

(56) References Cited

U.S. PATENT DOCUMENTS 4,292,519 A * 9/1981 Feuerbaum ............. 250/310
4,355,232 A * 10/1982 Todokoro et al. ............ 250/310
5,030,908 A * 7/1991 Miyoshi et al. ............. 324/752
6,859,052 B1 * 2/2005 Vaucher ..................... 324/751

FOREIGN PATENT DOCUMENTS

EP    0617294 A2    9/1994
WO    0138892 A     5/2001

* cited by examiner

*Primary Examiner*—Minh N Tang
(74) *Attorney, Agent, or Firm*—Lowe Hauptman Ham & Berner, LLP

(57) ABSTRACT

A non-contact testing of electrical characteristics of substrates carrying dense electrical connections is non-contact in that an injection or an extraction of electrons in the conductors to be tested, is obtained by an electron tearing effect under the effect of an electromagnetic beam of ultraviolet rays. The test device has an electron collector plate conformed as an array of individually addressable electrodes, able to be taken to a positive or negative potential in order to carry out an injection or an extraction of electrons. A capacitor is associated with each electrode. The individual electrode is produced in the form of an open-work conductive grid constituting a first plate of the capacitor. The other plate is constituted by an open-work grid situated plumb with the first one.

6 Claims, 2 Drawing Sheets

NON-CONTACT ELECTRICAL CONNECTIONS TEST DEVICE

RELATED APPLICATIONS

The present application is based on, and claims priority from, France Application Number 06 01385, filed Feb. 17, 2006, the disclosure of which is hereby incorporated by reference herein in its entirety.

BACKGROUND OF THE INVENTION

1. Field of the Invention

The invention relates to the non-contact testing of electrical characteristics of electronic components, such as the insulation between conductors, the electrical continuity of conductors, resistance, and even capacity and inductance. The testing is non-contact in the sense that an injection or an extraction of electrons in the conductors to be tested is obtained by an electron tearing effect under the effect of an electromagnetic beam (in principle a beam of ultraviolet rays) having a photon energy greater than the energy for extracting an electron from the conductor.

2. Brief Description of the Related Art

Non-contact test devices are principally intended for checking the electrical interconnections in interconnection supports such as printed circuits or, above all, integrated circuit support substrates (known as "chip-carriers") having a very large number of output terminals. With the reduction of the dimensions of integrated circuits and the increase in the density of the connections, electrical testing becomes difficult and can no longer be done by direct contact between test points and the conductive areas to be tested.

Typically, in order to mount an integrated circuit on a printed circuit, there is interposed an interconnection substrate (or "chip-carrier") having hundreds of very dense contact areas on the side which receives an integrated circuit chip which has a very large number of contacts, and having an often smaller number of contact areas on the rear, on the side which will be soldered on the printed circuit. As much as it is possible to apply test points on the rear side, in the form of what is known as a "bed of nails", that is to say an addressable matrix of contact points, because the contact density is lower, it is however almost impossible to do so on the side which carries the chip. Non-contact test systems have therefore been developed to allow the testing of the interconnection substrate from the side which carries the chip. The testing can moreover be carried out in a mixed manner with test points (or another access mode using direct contact) on the less dense rear face and a non-contact test on the more dense front face.

There have already been proposed non-contact test devices capable of either extracting electrons from a conductor to be tested, or of injecting electrons into that conductor, or finally of carrying out an extraction operation and an injection operation simultaneously on two portions of conductor in order to test the insulation, continuity, or resistance between these two portions. The patent application WO 01/38892 and the patent U.S. Pat. No. 4,573,008 describe such devices.

BRIEF DESCRIPTION OF THE INVENTION

The test principle is reviewed briefly here: for the extraction of electrons, a narrow beam of ultraviolet rays is directed very accurately onto a portion of conductor of the interconnection substrate to be tested, for example a contact area intended to be soldered subsequently to an integrated circuit chip; electrons are torn from that conductor and are drawn towards a collector (the term collector electrode will be used hereafter) taken to a sufficiently positive potential; the conductor is charged positively on losing electrons. It can be charged positively up to the potential of the collector electrode; for the injection of electrons, an ultraviolet beam is directed towards an emitter electrode, tearing electrons from the latter; the electrons are attracted by a conductor of the substrate to be tested, provided that the latter is at a sufficiently positive potential with respect to the emitter electrode; the conductor is charged negatively on gathering electrons, possibly down to the potential of the emitter electrode.

These two charging possibilities, positive or negative, allow various electrical tests of electrical insulation between two conductors, of electrical continuity of two portions of a same conductor, of resistance of a conductor, and even of inductance and of capacity, and this is done without contact.

Alternatively, for a test involving both a conductor of the front face and a conductor of the rear face of the substrate to be tested, it is possible to provide for charging a conductor without contact on the side where the conductors are more dense and to apply a potential by direct contact on the side where the conductors, less dense, are more easily accessible.

The side where the conductors are charged or discharged without contact will be described here.

In order to extract or to inject electrons from or into any portion of conductor of the substrate to be tested, provision is preferably made for the electrodes to be arranged in the form of a matrix array of lines and columns of small individual elementary electrodes, insulated from each other and selectively addressable in order to be able to be individually taken to a desired potential, either negative or positive depending on whether it is desired to extract electrons from it or to inject electrons into it. The collector and emitter electrodes are therefore constituted in exactly the same way, but they perform a collecting or emitting function depending on the potential to which they are taken. In the rest of the description only collector electrodes will be spoken of for the purpose of simplification, knowing that they indifferently perform the collecting or emitting function, and the plate which carries the addressable array of electrodes will be referred to as the collector plate.

In order to measure the insulation or electrical continuity characteristics of the substrate, there is furthermore associated with each individual collector electrode a measuring capacitor. The measuring capacitor serves both to maintain a bias potential of the collector electrode for a certain time and to store the electrical charges displaced at the moment of extraction or of injection of electrons, for the purpose of reading these charges (subsequently or simultaneously).

For example, the measuring capacitor can initially be taken to a reference potential and secondly it can be connected to a charge-reading circuit; the charge-reading circuit will measure the possible loss of charge due to an insulation fault between two points.

The collector plate therefore comprises at least: an array of collector electrodes each associated with a local capacitor, a line and column addressing circuit in order, on the one hand, to apply desired potentials to the electrodes or the capacitor and, on the other hand, to read potentials present on the electrodes and the capacitor.

The addressing circuit comprises buses having one or more line conductors, buses having one or more column conductors and, locally close to each individual electrode, circuitry of several transistors connected to these buses; the buses and the transistors are deposited as a thin film (the transistors are known as TFT or "Thin Film Transistors") on the plate which is both electrically insulating and transparent to the electromagnetic radiation (in principle ultraviolet rays) used.

The array of electrodes and the circuitry associated with each electrode, capacitor, transistors and conductive connections occupy a large amount of space on the collector plate. Now, the electromagnetic beam which is used for bombarding either an electrode or a conductor of the substrate to be tested is applied through the collector plate since the electromagnetic source cannot be placed in the narrow gap between the collector plate and the substrate to be tested: if the substrate to be tested is situated below the collector plate, then the radiation source is situated above the plate. The elements present on the collector plate therefore degrade the transparency of the plate and impede the passage of the beam towards the conductor to be charged or discharged.

In order to facilitate the passage of the beam, provision is firstly made for the electrodes to be produced in the form of an open-work conductive grid.

Furthermore, according to the invention, provision is made for the capacitor associated with each individual electrode to be produced by a first plate constituted by the electrode itself, in the form of an open-work conductive grid, and by a second plate constituted by another open-work conductive grid, situated below the first grid and separated from it by a layer of dielectric material.

Consequently, according to the invention, there is proposed a non-contact device for testing a substrate comprising conductive connections, the device comprising a collector plate provided with an array of individual electrodes each associated with a local capacitor and provided with addressing circuits for taking a chosen electrode and the associated capacitor to desired potentials and/or for measuring the potential of the electrodes or of the capacitor, and a source of electromagnetic illumination able to illuminate a particular zone of a conductive connection of the substrate in order to carry out an extraction of electrons from that zone or an injection of electrons into that zone, each individual electrode being produced in the form of an open-work conductive grid, a first plate of the capacitor comprising the open-work grid and a second plate of the capacitor comprising a second open-work conductive grid situated facing the first grid and separated from it by a layer of dielectric material.

By the superimposition of two open-work grids forming both the collector electrode and the measuring capacitor associated with it, the transparency of the collector plate with respect to the illuminating beam is maximized without reducing the capacity value of the capacitor too much.

The extraction of electrons from a conductive connection of the substrate to be tested is preferably carried out by the direct illumination of that connection through the collector plate, the potential of at least one collector electrode facing the illuminated particular zone being more positive than that of the connection.

The injection of electrons is preferably carried out by the illumination of that conductive connection through the collector plate, reflection of the beam on the connection towards at least one collector electrode and extraction of electrons from that electrode by the reflected beam, the potential of the electrode illuminated by reflection being more negative than the potential of the illuminated conductive connection.

BRIEF DESCRIPTION OF THE DRAWINGS

Other features and advantages of the invention will become apparent on reading the following detailed description with is given with reference to the appended drawings in which.

DETAILED DESCRIPTION OF THE PREFERRED EMBODIMENTS

Figure 1:
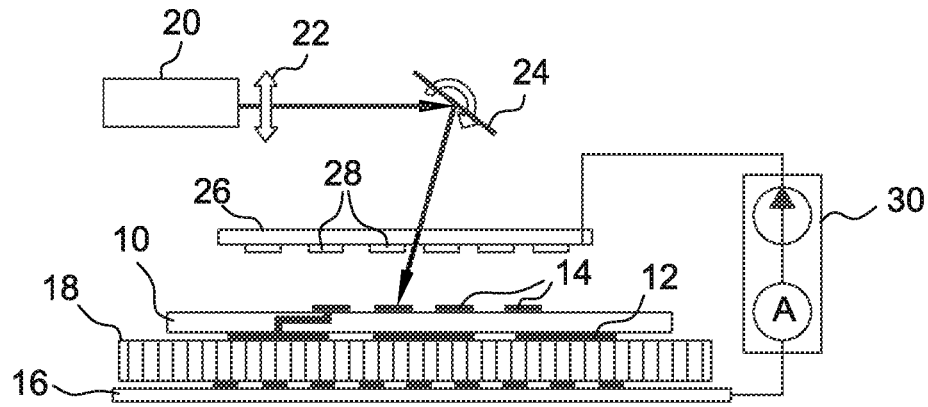
FIG. 1 is a diagram of the test device according to the invention.

The general principle of a non-contact test is shown diagrammatically in FIG. 1. The substrate to be tested is given the reference 10; it is for example of the type known as a "chip carrier" having multiple interconnections between a rear face (at the bottom of the figure) and a front face (at the top of the figure). The rear face is intended to be soldered on a printed circuit and the front face is intended to receive an integrated circuit chip. The connections of the rear face are given the reference 12. They principally comprise soldering areas making it possible to solder the substrate directly onto a printed circuit. The connections of the front face, more dense than those of the rear face, are given the reference 14. These connections 14 principally comprise contact pads, or soldering areas, making it possible to connect, by direct soldering, that area directly to an output pin of a printed circuit chip (soldering of the "flip-chip" type, that is to say with the chip turned over with its face against its support). In the following text, for both the rear face and the front face, the expressions "conductors" or "conductive connections" or "soldering areas" or "contact pins" will be used indifferently, it being understood that the envisaged test aims to test in a general manner any electrical conductor whatsoever that is accessible from these faces, but that most often the test will be carried out on contact pins. Each one of the contact pins or soldering areas of the font face comprising, for example, a bead of indium solder.

The test to be carried out can comprise: insulation or electrical continuity tests between two conductors on the front face; possibly tests for resistivity, capacity and inductance between these conductors; similar tests (insulation, continuity, etc.) between a conductor on the front face and a conductor on the rear face.

In the following text, it will be considered that if conductors on the rear face are involved in the test, then these conductors are accessed by direct electrical contacts using test points or other means because the density of the conductors on the rear face allows this. Consequently, non-contact access will be considered only for the conductors of the front face, but it is understood that if the density of conductors on the rear face requires it, it is also possible to use non-contact electrical access for the connections on the rear face.

On the rear face side, there has therefore been shown an addressing array 16 making it possible to establish an electrical connection by direct physical contact with a soldering area 12 of the rear face. The addressing array 16 can be connected to contact areas of the rear face by the intermediary of a sheet of contact points 18 constituted by either a test bed of nails or by a simple anisotropic conduction layer: this anisotropic conduction layer establishes an electrical current connection in the vertical direction (transversely with respect to the layer) but not in the horizontal direction, such that if a conductor of the array 16 is supplied with voltage, this voltage will be applied to a contact area 12 located above that conductor, but not to other contact areas. It is thus possible, for a test which involves a conductor on the rear face, to apply a desired potential by addressing this conductor from the array 16, and reading a current traversing that conductor during the test.

On the front face, the test is without contact: a source of electromagnetic radiation 20, preferably ultraviolet light, associated with focussing optics 22 and deflection optics 24 (for example a controlled orientation mirror), directs a narrow beam onto a chosen point of a conductor to be tested. The test machine is controlled by a program to illuminate successively, by an appropriate control of the mirror, the thousands of points that generally have to be tested in an interconnection substrate. The energy of the radiation tears electrons from the conductor. These electrons are attracted by a collector plate 26 taken to a potential more positive than the potential of the illuminated conductor. The conductor is thus charged up to a positive potential as the extraction of electrons progresses, precisely as if a current was made to flow in the conductor. The current can be measured at this stage or at a subsequent stage, or the potential of the conductor can be measured at this stage or at a subsequent stage.

The collector plate 26 is placed in the immediate proximity of the substrate to be tested, in order to avoid having to apply too high potentials in order to produce the electrical field which will attract the electrons towards the collector plate. The gap between the substrate and the plate is a gap under deep vacuum in order that the electrons may circulate freely. The collector plate is placed between the ultraviolet radiation source and the substrate to be tested. It is partially transparent to the radiation, that is to say that its surface is not entirely occupied by the collector electrodes.

Furthermore, in order to make it possible to better locate the paths of the electrons between a conductor struck by the ultraviolet beam and the collector plate 26, the latter is divided into an array of a very large number of collector electrodes 28 which can be addressed individually. Each electrode for example has a side dimension of few tens of micrometres and the collector plates can comprise an array of several hundred electrodes in each line and several hundred electrodes in each column. Thus, by column and line addressing, it is possible to take one or more collector electrodes, located facing a substrate conductor to be charged positively, to a positive potential; the adjacent collector electrodes even being able to be taken to a negative potential in order to repel the electrons which could be directed towards them. The means of addressing the collector electrodes are not shown.

In order to allow the passage of the ultraviolet beam, the collector electrodes are each constituted in the form of an open-work grid. This is not shown in FIG. 1 considering the scale of the drawing.

As the test can necessitate not only extracting electrons from a conductor of the substrate to be tested, in order to charge it positively, but also the injection of electrons into the conductor in order to charge it negatively, the following arrangement is also provided: the beam of ultraviolet light can also indirectly bombard an individual collector electrode, charged to a potential more negative than the conductor to be tested. This extracts electrons from the electrode and these electrons are attracted towards the conductor to be tested, thus carrying out an injection of electrons into the conductor. The indirect bombardment consists in reflecting a part of the ultraviolet beam onto the conductor to be tested, and the reflected radiation itself bombarding a collector electrode situated immediately facing it. The conductor of the substrate, placed at a potential more negative than the electrode which emitted the electrons, gathers the latter. Electrons are of course torn from the conductor during its illumination but they drop back onto the conductor, not being attracted by a collector electrode as soon as the collector electrodes are at a sufficiently negative potential. Here again it is understood that the collector plate must be sufficiently transparent to allow the ultraviolet beam to be able to strike the conductors and that a sufficient portion is reflected towards a collector electrode.

It is thus possible to inject electrons into a conductor at the same time as extracting electrons from that same conductor or from another conductor since the potentials of the individual electrodes are separately controllable (provided of course that it is possible to illuminate two zones of the substrate simultaneously). This makes it possible to test an insulation or an electrical continuity by measuring the current which flows between the point where the electrons are injected and the point where they are extracted.

The circuits for addressing the collector electrodes and the circuits for addressing the conductors on the rear of the interconnection substrate are not shown. At reference 30, there has been shown symbolically a circuit for measuring current flowing between a conductor on the rear face and a conductor on the front face of the interconnection substrate. But it is also possible to measure current between two conductors on the front face, or to store in a capacitor a charge that has flowed during an injection of electrons or an extraction of electrons and to then read the stored charge.

Figure 2:
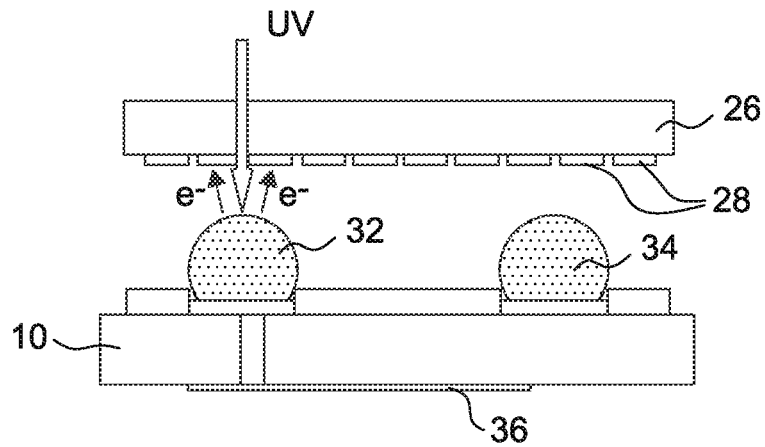
FIG. 2 shows a detail of the injection of charge on a conductive contact area of an interconnection substrate to be tested.
Figure 3:
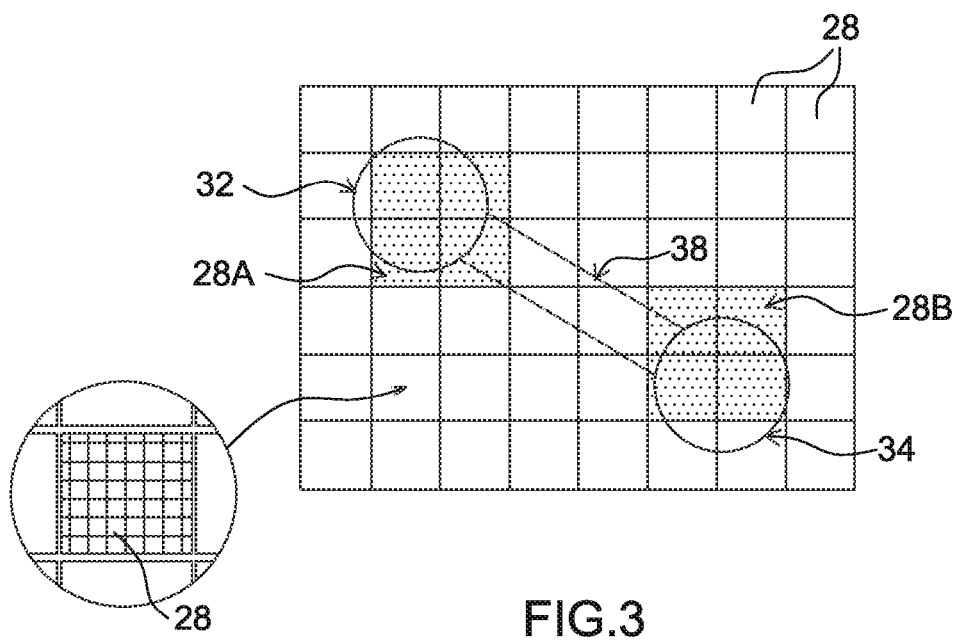
FIG. 3 shows a plan view corresponding to FIG. 2.

In FIGS. 2 and 3, there have been shown in a more realistic manner a portion of substrate 10 to be tested with, on the front face of the substrate, two conductors in the form of two soldering areas each comprising a bead of solder 32 and 34 respectively (beads of indium or others). The left conductor 32 is connected to a conductor 36 on the rear face of the substrate, such that it is possible to choose the potential to which it is taken by the addressing array 16 of FIG. 1. The right conductor 34 is not connected to a conductor on the rear face and it is by the ultraviolet beam that electrons are injected into it or extracted from it. This figure shows that it is possible, by extracting electrons from the contact pin 32, to check that this pin is correctly connected to the conductor 36 on the rear face, simply by measuring the current flowing in the measuring circuit 30 of FIG. 1. But it can be understood that it is also possible to carry out measurements of insulation between a contact point such as 32 and a contact point such as 34, or measurements on two contact points such as 34, not connected to a contact point on the rear face. The dense array of collector electrodes 28 can be seen under the collector plate 26.

FIG. 3 is a plan view showing both the configuration of the two contact points 32 and 34 with their beads and the chess-board configuration of the array of electrodes 28 facing these contact points. An individual electrode corresponds to a square of the chess-board and each individual electrode can be taken to a chosen potential independently with regard to the potential of the other electrodes.

In FIGS. 2 and 3, each individual electrode is shown as being solid in order to simplify the figure. In reality, each electrode is constituted in the form of an open-work conductive grid because of the necessity of transparency to the radiation from the source 20. Moreover, in FIG. 3, the chess-board of electrodes seems to practically cover the whole of the area of the collector plate. In reality the electrodes occupy only a part of that area: line conductors and column conductors must be inserted between the horizontal and vertical rows of electrodes, and each individual electrode is locally associated with a switching circuit having several transistors which allows both the selection of an individual electrode (at the crossing of a line and a column of the array) and the choice of a potential to be applied to that electrode. These components, line and column conductors and transistors of the addressing circuit, are not shown in FIGS. 2 and 3 considering the scale of these figures but they occupy a part of the area of the collector plate. Finally, with each individual electrode is associated a measuring capacitor, which is also not shown in FIGS. 2 and 3, disposed locally in the zone corresponding to an individual electrode, that is to say in a square of the chessboard. This capacitor is electrically connected to the individual collector electrode which is associated with it.

According to the invention, as will be explained later, this capacitor comprises two plates, one of which is the electrode itself in the form of an open-work grid and the other of which is also an open-work grid situated below the electrode and facing it.

FIG. 3 makes it possible to understand how potentials will be applied to the collector electrodes, according to their position with respect to the individual spot conductive zones in which it is desired to inject or extract electrons: in order to extract electrons, for example from the contact point 32 whose area represents several adjacent electrodes, the several individual electrodes which are facing this contact point will be taken to a positive potential; in this case four electrodes shown shaded and given the overall reference 28A; the electrodes which surround them can remain at a zero potential or can even be taken to a negative potential; conversely, in order to inject electrons, the electrodes will be taken to a negative potential, and the surrounding electrodes will be left at zero potential; or even a positive one; for example four electrodes given the overall reference 28B and placed facing the conductive contact point 34 can be taken to a negative potential. It is thus possible, for example, to test for the desirable or undesirable presence, or the characteristics, of a conductive path between the contact points 32 and 34, indicated symbolically by the reference 38 in FIG. 3.

Figure 4:
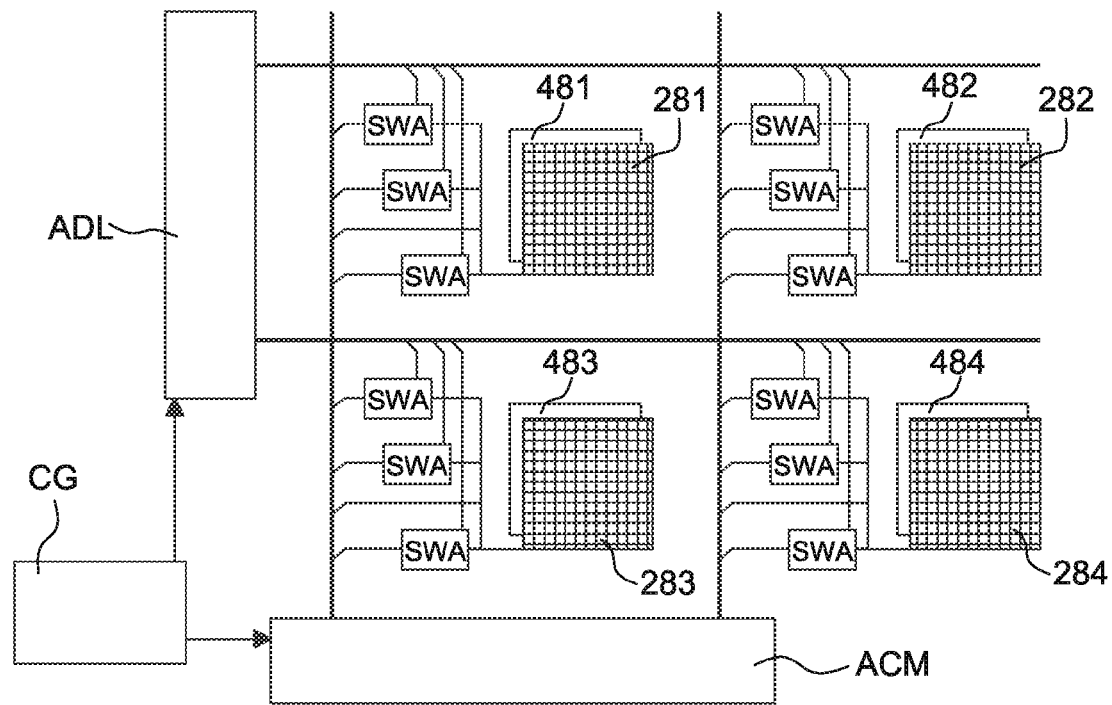
FIG. 4 is a block diagram of the addressing and measuring circuits of the test device according to the invention.

FIG. 4 is a diagrammatic representation of the electrical circuitry which corresponds to that which has just been described. Only two lines and two columns of electrodes have been shown, that is to say four individual electrodes in total. The electrons are referenced 281 and 282 for the first line, 283 and 284 for the second line. They are drawn in the form of a chess-board to signify that they are constituted by open work grids. Behind each electrode there has been shown a second capacitor plate, 481, 482, 483 and 484 respectively. This second plate is not shown in the form of a chess-board in order not to make the drawing too confused, but it is of course constituted by an open-work grid of design identical to that of the collector electrode. The two grids are separated electrically by a dielectric layer which is not shown in FIG. 4.

With each individual electrode there is locally associated an individual switching circuit. In the example shown, it has been considered that this switching circuit comprises three analogue switches denoted by the reference SWA, each of which can each be produced by a thin film transistor (TFT). In general, all of the electrical circuits formed on the collector plate can be constituted by thin film circuits. Moreover, for the addressing of the individual electrodes, there have been provided, on the collector plate 26, buses of line and column conductors, situated between the lines and the columns of electrodes. The switches SWA are controlled by the conductors of the line bus; they make it possible to connect, by the column bus, the first or the second plate of the capacitor to the addressing circuitry outside of the array of electrodes in order to: apply chosen potentials to one and the other of the plates on the one hand, and to measure the potential of the electrodes or read the charges stored in the capacitor on the other hand.

FIG. 4 shows a line addressing circuit ADL which controls the line bus conductors in order to simultaneously make the transistors connected to a chosen conductor conductive, and a measuring circuit ACM which selects the column bus conductors in order to apply to them potentials or in order to there read potentials or flows of electric charges. A general controller CG controls the overall operation of the whole of the circuitry present on the collector plate 26.

Figure 5:
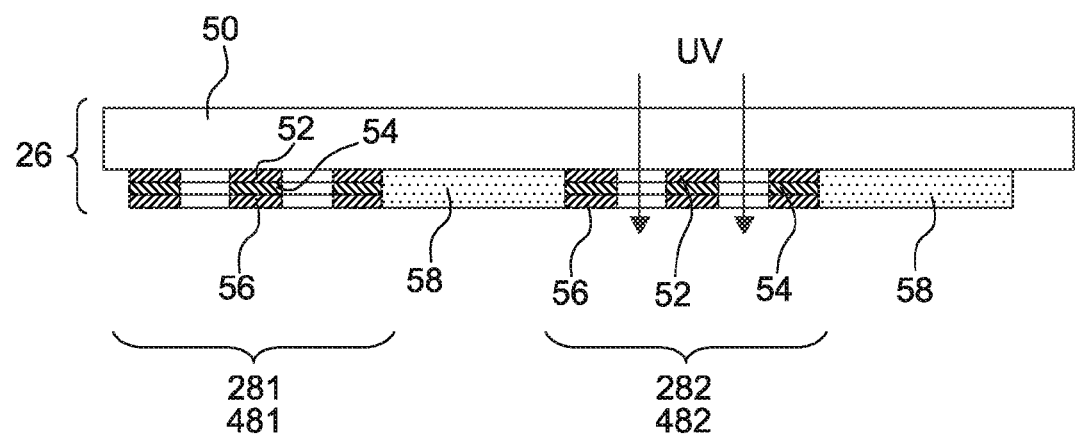
FIG. 5 shows a detail of the embodiment of the collector plate having addressable electrodes with the measuring capacitor associated with each individual collector electrode.

Finally, FIG. 5 makes it possible to understand how the measuring capacitor is produced by the superimposition of two open-work grids separated by a dielectric layer. The collector plate is for example a glass plate 50 upon which are formed, by depositing techniques and thin film etching, the electrodes, the capacitor, the individual switching circuits, the line and column bus conductors and possibly other circuit components. In FIG. 5 are shown two adjacent electrodes 281 and 282 and the corresponding capacitor plates 481 and 482 and, for purposes of simplification, it has been assumed that the open-work grids comprise only three bars each.

The collector plate 26 comprises for example an electrically insulating support that is transparent to ultraviolet rays, for example a glass plate 50. Upon this glass plate are successively deposited and etched a conductive layer 52 constituting the plates 481 and 482 of the capacitor, a dielectric layer 54 and a conductive layer 56 constituting the collector electrodes 281, 282, which themselves constitute the other plates of the capacitors. The conductive layers 52 and 56 can be made of metal (for example aluminium, copper, tungsten or metallic alloy) etched in the form of an open-work grid. The dielectric layer 54 can, for example, be made of silicon nitride or oxide). The etching of the two conductive layers is such that the collector electrode in the form of an open-work grid comes exactly above the first open-work grid whilst remaining separated from it by the dielectric layer. The two conductive layers can be made of the same material. In the open-work zones, there is no obstacle to the passage of the ultraviolet radiation, such that a large fraction of the ultraviolet beam can traverse the plate in order to reach a conductor of the substrate to be tested below the plate.

The other circuit components are placed outside of the zones reserved for the open-work grid: line and column conductors and transistors. These components are localized in zones indicated by 58 in FIG. 5. These zones can be of small size since they do not comprise any measurement capacitors. The two plates of the capacitor are connected, by the switches of the switching circuit, to column conductors.

In an example of use of the test device according to the invention, it is possible to test the insulation between two conductors on the front face of the interconnection substrate. The following method is given solely as an example.

Firstly a reference potential (earth potential for example) is applied to the conductors to be tested, which can be done by a conventional means such as a carbon brush rubbed on the front face of the substrate to be tested. The following operations are then carried out: the first conductor is taken to a positive potential Vp by ejecting electrons from that conductor by direct ultraviolet illumination through the collector plate, a first collector electrode (at least), situated facing the first conductor, being taken to a positive potential and the adjacent electrodes remaining at a zero or negative potential. Then, after a predetermined time lapse, the second conductor is taken to the same positive potential Vp by injecting electrons into that conductor by direct ultraviolet illumination of the second conductor, at least one collector electrode, situated facing the second conductor, being taken to a positive potential and the others to a negative potential. During this negative charging of the second conductor, the quantity of charges flowing from the collector electrode to the second conductor is measured. If it is equal to a reference value obtained by preliminary calibration, this means that at the time of the second illumination, the second conductor was still at the reference potential and that it has not been influenced by the positive potential of the first conductor. If, on the contrary, the quantity of charges is less than this reference value, or even if it is zero, this means that the potential of the second conductor has increased under the influence of the charge of the first conductor, revealing faulty insulation between the two conductors. According to the chosen time interval, the chosen potential and the measured quantity of charges, it is possible to determine a leakage resistance between the conductors and to determine if the interconnection substrate must be considered as defective.

In another example of use, the electrical continuity between two conductors on the front face of the substrate is tested. This operation assumes that two ultraviolet sources are available to separately illuminate the two conductors. The first conductor is charged to a positive potential Vp with respect to the reference potential, and the second conductor to a negative potential. The positive charging is done by direct illumination of the first conductor, at least one first collector electrode, above the conductor, being taken to a positive potential and the surrounding electrodes being at a negative potential. The negative charging is done by the indirect illumination of a collector electrode situated above the second conductor and taken to a negative potential (the surrounding electrodes being at a positive potential); the indirect illumination is carried out by reflection of the ultraviolet beam on the second conductor.

The charges of electrons flowing in the electrodes during this double illumination are measured for the first electrode and the second electrode. The analysis of the charges, compared with calibration charts, provides indications regarding the electrical resistance present between the first and second conductors.

Other methods of using the device can be envisaged: for example, in order to test the insulation of a conductor with respect to the rest of the substrate it is possible to simply charge that conductor by extraction of electrons under illumination, up to a positive potential (all the others having previously been taken to zero), and observing: if the charging current finishes by becoming nullified at the end of a certain time, showing that there is no significant current leakage preventing the charging of the conductor to the positive potential; or if, on the contrary, a charging current persists, showing that there is an insulation defect.

The invention claimed is:

1. A non-contact device for testing a substrate having conductive connections, the device, comprising:
   a collector plate provided with an array of individual electrodes each associated with a local capacitor and provided with addressing circuits for taking a chosen electrode and the associated capacitor to desired potentials and/or for measuring the potential of the electrodes or of the capacitor, and
   a source of electromagnetic illumination able to illuminate a particular zone of a conductive connection of the substrate in order to carry out an extraction of electrons from that zone or an injection of electrons into that zone, each individual electrode being produced in the form of a first open-work conductive grid, said first grid serving as the first plate of the capacitor, and a second plate of the capacitor comprising a second open-work conductive grid situated facing the first grid and separated from the first grid by a layer of dielectric material.

2. The non-contact test device according to claim 1, comprising means for taking at least one individual electrode situated above said particular zone to a potential more positive than that of said conductive connection.

3. The non-contact test device according to claim 1, comprising means for taking at least one individual electrode situated above said particular zone to a potential more negative than that of said conductive connection.

4. The non-contact test device according to claim 1, wherein the source of electromagnetic illumination is a source of ultraviolet rays.

5. The non-contact test device according to claim 2, wherein the source of electromagnetic illumination is a source of ultraviolet rays.

6. The non-contact test device according to claim 3, wherein the source of electromagnetic illumination is a source of ultraviolet rays.

* * * * *